United States Patent [19]

Saitoh et al.

[11] Patent Number: 4,804,558

[45] Date of Patent: Feb. 14, 1989

[54] PROCESS FOR PRODUCING ELECTROLUMINESCENT DEVICES

[75] Inventors: Keishi Saitoh, Nabari; Masaaki Hirooka, Toride; Junichi Hanna; Isamu Shimizu, both of Yokohama, all of Japan

[73] Assignee: Canon Kabushiki Kaisha, Tokyo, Japan

[21] Appl. No.: 942,793

[22] Filed: Dec. 17, 1986

[30] Foreign Application Priority Data

Dec. 18, 1985 [JP] Japan ............................ 60-285281

[51] Int. Cl.[4] ........................ B05D 5/06; B05D 5/12; C23C 16/30

[52] U.S. Cl. ........................................ 427/66; 427/70; 427/255; 427/255.2; 427/419.1

[58] Field of Search .................. 427/69, 66, 70, 255.2, 427/255, 404, 419.1, 419.2, 419.7; 428/690, 691, 697

[56] References Cited

U.S. PATENT DOCUMENTS

| | | | |
|---|---|---|---|
| 2,659,678 | 11/1953 | Cusano et al. | 427/69 |
| 2,685,530 | 8/1954 | Cusano et al. | 427/70 |
| 2,732,312 | 1/1956 | Young | 427/69 |
| 2,732,313 | 1/1956 | Cusano et al. | 427/69 |
| 2,967,111 | 1/1961 | Coghill et al. | 427/70 |
| 3,113,040 | 12/1963 | Winston | 427/69 |
| 3,347,693 | 10/1967 | Wendland | 427/69 |
| 3,664,866 | 5/1972 | Manasevit | 427/255.2 |
| 3,708,708 | 1/1973 | Soxman | 427/69 |
| 3,894,164 | 7/1975 | Dismukes et al. | 427/70 |
| 4,098,919 | 7/1978 | Morimoto et al. | 427/69 |
| 4,496,610 | 1/1985 | Cattell | 427/255.2 |
| 4,529,885 | 7/1985 | Waite et al. | 427/70 |
| 4,552,782 | 11/1985 | Cattell et al. | 427/70 |

FOREIGN PATENT DOCUMENTS

| | | | |
|---|---|---|---|
| 599073 | 5/1960 | Canada | 427/69 |
| 820777 | 9/1959 | United Kingdom | 427/69 |

*Primary Examiner*—Sadie Childs

*Attorney, Agent, or Firm*—Fitzpatrick, Cella, Harper & Scinto

[57] ABSTRACT

A process for producing an electroluminescent device comprises providing in a film forming space for forming an electroluminescent film a substrate having an electrode formed on the surface thereof, said electrtode optionally having a first insulating layer formed thereon, introducing into said film forming space the compounds (A), (B) and (C) represented by the general formulae (A), (B) and (C) shown below and a gaseous halogenic oxidizing agent capable of chemically reacting with at least one of said compounds (A), (B) and (C), respectively, to thereby form an electroluminescent film on said electrode of said substrate, and if desired forming a second insulating layer and electrode in succession thereon:

$$MmRn \quad (A)$$

$$AaBb \quad (B)$$

$$JjQq \quad (C)$$

wherein m is a positive integer equal to the valence of R or said valence multiplied by an integer, n is a positive integer equal to the valence of M or said valence multiplied by an integer, M is zinc (Zn) element, R is hydrogen (H), halogen (X) or hydrocarbon group; a is a positive integer equal to the valence of B or said valence multiplied by an integer, b is a positive integer equal to the valence of A or said valence multiplied by an integer, A is sulfur (S) or selenium (Se) element, B is hydrogen (H), halogen (X) or hydrocarbon group; j is a positive integer equal to the valence of Q or said valence multiplied by an integer, q is a positive integer equal to the valence of J or said valence multiplied by an integer, J is manganese (Mn) or a rare earth metal element, Q is hydrogen (H), halogen (X) or hydrocarbon group.

6 Claims, 1 Drawing Sheet

PROCESS FOR PRODUCING ELECTROLUMINESCENT DEVICES

BACKGROUND OF THE INVENTION

1. Field of the Invention

This invention relates to a process for producing an electroluminescent device (hereinafter called "EL device") to be used for a flat plate type display, various light sources and illuminations or the like and to an EL device obtained by the process.

2. Related Background Art

EL device which can emit light by application of an electrical field on a solid electroluminescent film is expected to be promising as a display device which can compete with CRT in the points that it can be made as a thin film and lightweight, that it is free from flicker and also that it can be driven at a low voltage. However, the EL devices obtained up to date are low in luminescence efficiency and also unsatisfactory in luminance. This may be considered to be due to the causes that crystallinity of the luminescent layer is poor, that scattering of electrons may be caused by impurities, etc., whereby no sufficient exitation can be accomplished.

In the method for production of EL devices known in the prior art, as the method for depositing electroluminescent films thereof (hereinafter called "EL luminescent film"), there may be included the vapor deposition method, the CVD method, the MOCVD method, the sputtering method, the ALE method (atomic layer epitaxy) method, etc., and the plasma CVD method.

The reaction process in formation of a deposited film according to the plasma CVD method which has been generalized in the prior art is considerably complicated as compared with the CVD method of the prior art, and its reaction mechanism involves not a few ambiguous points. Also, there are a large number of parameters for formation of a deposited film (for example, substrate temperature, flow rate and flow rate ratio of the introduced gases, pressure during formation, high frequency power, electrode structure, structure of the reaction vessel, speed of evacuation, plasma generating system, etc.). By use of a combination of such a large number of parameters, the plasma may sometimes become unstable state, whereby marked deleterious influences were exerted frequently on the deposited film formed. Besides, the parameters characteristic of the device must be selected for each device and therefore under the present situation it has been difficult to generalize the production conditions.

However, depending on the application use of the deposited film, bulk production with reproducibility must be attempted with full satisfaction of enlargement of area, uniformity of film thickness as well as uniformity of film quality, and therefore in formation of a deposited film according to the plasma CVD method, enormous installation investment is required for a bulk production device and also management items for such bulk production become complicated, with a width of management tolerance being narrow and the control of the device being severe. These are pointed as the problems to be improved in the future.

On the other hand, in the prior art technique according to conventional CVD method, high temperature was required and also no deposited film satisfactory on the industrial level can be necessarily obtained.

As described above, in formation of a functional film it has been strongly desired to develop a deposited film which is capable of bulk production by means of a device of low cost while ensuring practically useful characteristics and uniformness.

SUMMARY OF THE INVENTION

The present invention eliminates the drawbacks of the prior art as described above and at the same time provides a process for producing a novel EL device not produced by the method of the prior art and an EL device obtained by the process.

An object of the present invention is to provide an EL device improved in electroluminescent luminance and life as compared with those of the prior art devices.

Also, another object of the present invention is to provide a process for producing an EL device which can manage easily the characteristics of the EL luminescent film formed to maintain its good characteristics and can also accomplish easily simplification of management of production conditions and bulk production, while effecting improvement of electroluminescent luminance, life and deposition speed.

According to the present invention, there is provided a process for producing an electroluminescent device, which comprises providing in a film forming space for forming an electroluminescent film a substrate having an electrode formed on the surface thereof, said electrode optionally having a first insulating layer formed thereon, introducing into said film forming space the compounds (A), (B) and (C) represented by the general formulae (A), (B) and (C) shown below and a gaseous halogenic oxidizing agent capable of chemically reacting with at least one of said compounds (A), (B) and (C), respectively, to thereby form an electroluminescent film on said electrode of said substrate, and if desired forming a second insulating layer and electrode in succession thereon:

$$MmRn \quad (AS)$$

$$AaBb \quad (B)$$

$$JjQq \quad (C)$$

wherein m is a positive integer equal to the valence of R or said valence multiplied by an integer, n is a positive integer equal to the valence of M or said valence multiplied by an integer, M is zinc (Zn) element, R is hydrogen (H), halogen (X) or hydrocarbon group; a is a positive integer equal to the valence of B or said valence multiplied by an integer, b is a positive integer equal to the valence of A or said valence multiplied by an integer, A is sulfur (S) or selenium (Se) element, B is one of hydrogen (H), halogen (X) or hydrocarbon group; j is a positive integer equal to the valence of Q or said valence multiplied by an integer, q is a positive integer equal to the valence of J or said valence multiplied by an integer, J is manganese (Mn) or a rare earth metal element, Q is one of hydrogen (H), halogen (X) or hydrocarbon group.

DESCRIPTION OF THE PREFERRED EMBODIMENTS

Referring now to a typical example of the EL device according to the present invention, the present invention is to be explained.

Figure 1:
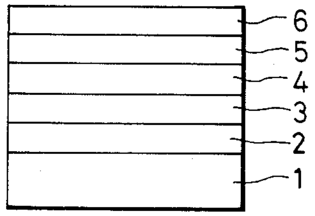
FIG. 1 is a schematic sectional view representing the layer constitution of the EL device according to the present invention.

FIG. 1 is a schematic sectional view for illustrating the layer constitution of a typical EL device according to the present invention. In FIG. 1, 1 is a substrate which may be transparent as required such as glass substrate, etc., 2 is an electrode which comprises an electrode material such as indium oxide added with tin (ITO), etc. and may be transparent as required, 3 is an insulating layer comprising an electrically insulating material such as $Y_2O_3$, etc., 4 is an EL luminescent layer, 5 is an insulating layer comprising an electrically insulating material such as $Y_2O_3$, etc., and 6 is an electrode which comprises a material such as Al, etc. and may be transparent as required. One of the electrodes 2 and 6 from the side of which the light emitted by the EL luminescent layer 4 is taken outside is transparent to the luminescent light.

The EL luminescent layer 4 is constituted of ZnS or ZnSe in which Mn or a rare earth element such as Pr, Sm, Eu, Tb, Dy, Ho, Er, Tm, Nd, etc., or fluorides of those rare earth elements are included.

In the method of the present invention, during formation of a film as the desired EL luminescent layer, the parameters for formation of the film become the amounts of the compounds (A), (B) and (C) represented by the above formulae (A), (B) and (C), respectively and the gaseous halogenic oxidizing agent which can chemically react with at least one of these compounds to be introduced, the temperature of the substrate and the temperature within the film forming space and the inner pressure within the film forming space, and therefore it becomes easier to control the film forming conditions and films as the EL luminescent layer with reproducibility and bulk productivity can be formed.

The halogenic oxidizing agent to be used in the present invention is made gaseous when introduced into the reaction space and at the same time has the property of effectively oxidizing any one of the compounds represented by the general formulae (A), (B) and (C), which is the gaseous starting material for formation of a deposited film (EL luminescent layer) introduced into the reaction space, by mere chemical contact therewith, including halogenic gas such as $F_2$, $Cl_2$, $Br_2$, $I_2$, etc., and fluorine, chlorine, bromine, etc., under nascent state as effective ones.

These halogenic oxidizing agents are introduced into the reaction space under gaseous state together with the gas of the starting material forfformation of a deposited film as described above with desired flow rate and feeding pressure given, wherein they are mixed with and collided against the above starting material to be contacted therewith, thereby oxidizing the above starting material to generate efficiently a plural kinds of precursors including precursors under excited state. Of the precursors under excited state and other precursors generated, at least one of them function as the feeding source for the constituent element of the deposited film formed.

The compounds (A), (B) and (C) represented by the above formulae (A), (B) and (C), respectively, to be used in the present invention should more desirably be selected from those capable of generating spontaneously chemical species which can contribute to formation of a deposited film to be formed on the substrate by causing molecular collision against the gaseous halogenic oxidizing agent as mentioned above in the space where the substrate for film formation thereon exists to effect chemical reaction therewith. However, if they are inert to the above gaseous halogenic oxidizing agent or have not so much activity as to spontaneously generate the above chemical species under ordinary existing state, it is necessary to excite the compounds (A), (B) and (C) to the state chemically reactive with the gaseous halogenic oxidizing agent by giving an excitation energy to the compounds (A), (B) and (C) with a strength which does not completely dissociate M, A and J in the compounds of the above formulae (A), (B) and (C) before or during film formation, and also the compounds which can be excited to such state may be employed as one of the compounds (A), (B) and (C) to be used in the present invention.

In the present invention, the compounds which have become the excited state as mentioned above are called hereinafter "precursor (E)".

In the present invention, effective compounds to be used as the compounds (A) RnMm, compounds (B) AaBb and compounds (C) JjQq represented by the aforementioned general formulae (A), (B) and (C) respectively may include the compounds shown below.

That is, compounds (A), (B) and (C) having Zn element as "M", S or Se element as "A", Mn, Pr, Sm, Eu, Tb, Dy, Ho, Er, Tm, Nd element as "J" can be employed.

Examples of "R", "B" and "Q" may include monovalent, divalent and trivalent hydrocarbon groups derived from straight chain and branched chain saturated hydrocarbons or unsaturated hydrocarbons, or monovalent, divalent and trivalent hydrocarbon groups derived from saturated or unsaturated monocyclic and polycyclic hydrocarbon.

The unsaturated hydrocarbon groups are not limited to only those having carbon-carbon bonds of a single kind of bond, but also those having at least two kinds of single bond, double bond and triple bond can be also effectively employed, provided that they can serve to accomplish the object of the present invention. Also, in the case of an unsaturated hydrocarbon group having a plural number of double bonds, it may be either a non-cumulative double bond or a cumulative double bond.

Examples of the non-cyclic hydrocarbon group may include alkyl, alkenyl, alkynyl, alkylidene, alkenylidene, alkynylidene, alkylidine, alkenylidine, alkynylidine, etc., as preferable ones. Particularly, it is preferable to use those having 1 to 10 carbon atoms, more preferably 1 to 7 carbon atoms, optimally 1 to 5 carbon atoms.

In the present invention, in selection of "R" and "M", "A" and "B", and "J" and "Q" as enumerated above, the combinations of "R" and "M", "A" and "B", and "J" and "Q" are selected so that the compounds (A), (B) and (C) effectively utilized may be selected which are gaseous under preperatory condition or readily gasifiable under use environment.

In the present invention, specific examples of the compounds (A) effectively used may include $ZnMe_2$, $ZnEt_2$, $ZnX_2$, etc.

Specific examples of the compounds (B) effectively used may include $Me_2S$, $Me_2Se$, $Et_2S$, $Et_2Se$, etc.

Specific examples of the compounds (C) effectively used may include $Me_2Mn$, $Me_3Pr$, $Me_3Sm$, $Me_3Eu$, $Me_3Tb$, $Me_3Dy$, $Me_3Ho$, $Me_3Er$, $Me_3Tm$, $Me_3Nd$, $Et_2Mn$, $Et_3Pr$, $Et_3Sm$, $Et_3Eu$, $Et_3Tb$, $Et_3Dy$, $Et_3Ho$, $Et_3Er$, $Et_3Tm$, $Et_3Nd$, $PrX_3$, $SmX_3$, $EuX_3$, $TbX_3$, $DyX_3$, $HoX_3$, $ErX_3$, $TmX_3$, $NdX_3$, etc.

In the above description, X represents a halogen (F, Cl, Br, I), and Me represents methyl group and Et represents ethyl group.

In the present invention, so that the deposit film forming process may proceed smoothly to form a film of high quality and having desired physical characteristics, as the film forming factors, the kinds and combination of the starting material and the halogenic oxidizing agent, mixing ratio of these, pressure during mixing, flow rate, the inner pressure of the film forming space, the flow types of the gases, the film forming temperature (substrate temperature and atmosphere temperature) are suitably selected as desired. These film forming factors are organically related to each other, and they are not determined individually but determined respectively under mutual relationships. In the present invention, the ratio of the gaseous starting material for formation of a deposited film and the gaseous halogenic oxidizing agent introduced into the reaction space may be determined suitably as determined in relationship of the film forming factors as related among the film forming factors as mentioned above, but it is preferably 1/20 to 100/1, more preferably 1/5-50/1 in terms of flow rate ratio introduced.

The pressure during mixing when introduced into the reaction space may be preferably higher in order to enhance higher the chemical contact between the above gaseous starting material and the above gaseous halogenic oxidizing agent in probability, but it is better to determine the optimum value suitably as desired in view of the reactivity. Although the pressure during mixing may be determined as described above, each of the pressure during introduction may be preferably $1\times10^{-7}$ atm to 10 atm, more preferably $1\times10^{-6}$ atm to 3 atm.

The pressure within the film forming space, namely the pressure in the space in which the substrate for film formation on its surface is arranged may be set suitably as desired so that the precursors (E) under excited state generated in the reaction space and sometimes the precursors (D) formed as secondary products from said precursors (E) may contribute effectively to film formation.

The inner pressure of the film forming space, when the film forming space is continuous openly to the reaction space, can be controlled in relationship with the introduction pressures and flow rates of the gaseous starting material for formation of a deposited film and a gaseous halogenic oxidizing agent in the reaction space, for example, by application of a contrivance such as differential evacuation or use of a large scale evacuating device.

Alternatively, when the conductance at the connecting portion between the reaction space and the film forming space is small, the pressure in the film forming space can be controlled by providing an appropriate evacuating device in the film forming space and controlling the evacuation amount of said device.

On the other hand, when the reaction space and the film forming space is integrally made and the reaction position and the film forming position are only different in space, it is possible to effect differential evacuation or provide a large scale evacuating device having sufficient evacuating capacity as described above.

Figure 2:
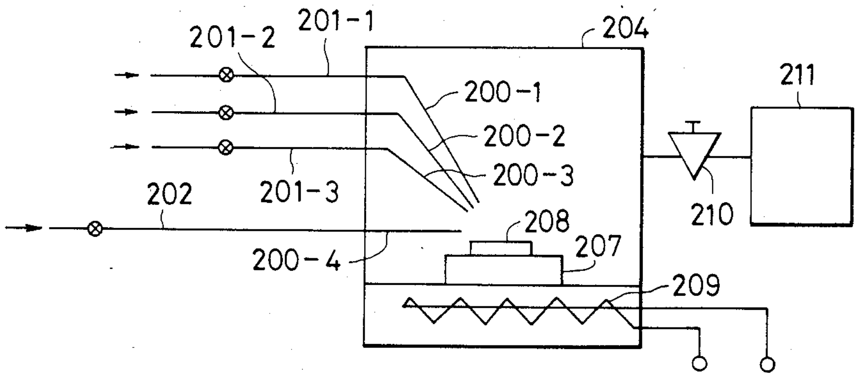
FIG. 2 is an example of the schematic illustration of the preparation device for EL device in the present invention.

As described above, the pressure in the film forming space may be determined in the relationship with the introduction pressures of the gaseous starting material and the gaseous halogenic oxidizing agent introduced into the reaction space, but it is preferably 0.001 Torr to 100 Torr, more preferably 0.01 Torr to 30 Torr, optimally 0.05 to 10 Torr.

ss for the flow type of the gases, it is necessary to design the flow type in view of the geometric arrangement of the gas introducing inlet, the substrate and the gas evacuating outlet so that the starting material for formation of a deposited film and the halogenic oxidizing agent may be efficiently mixed during introduction of these into the reaction space, the above precursors (E) may be efficiently generated and film formation may be adequately done without trouble. A preferable example of the geometric arrangement is shown in FIG. 2.

As the substrate temperature (Ts) during film formation, it can be set suitably as desired individually depending on the gas species employed and the kinds and the required characteristics of the deposited film formed, but, it is preferably from 50° C. to 1000° C., more preferably from 100° to 900° C., optimally from 100° to 750° C.

As the atmosphere temperature (Tat) in the film forming space, it may be determined suitably as desired in relationship with the substrate temperature (Ts) so that the above precursors (E) and the above precursors (D) as generated are not changed to unsuitable chemical species for film formation, and also the above precursors (E) may be efficiently generated.

The compound (A), the compound (B), the compound (C) and the gaseous halogenic oxidizing agent may be introduced into the film forming space through transporting pipes connected to the film forming space, or through transporting pipes with the tip ends extended near the film forming surface of the substrate placed in the film forming space and shaped in a nozzle. Alternatively, the transporting pipe may be made a double structure, and one of the materials may be transported through the innerside pipe and the other materials through the outside pipe, for example, the gaseous halogenic oxidizing agent through the innerside pipe and the compounds (A), (B) and (C) through the outside pipe, respectively, to be introduced into the film forming space.

Also, four nozzles connected to transporting pipes may be prepared, and the tip ends of the four ndzzles arranged in the vicinity of the surface of the substrate already placed in the film forming space, and the compounds (A), (B), (C) and the gaseous halogenic oxidizing agent discharged from the respective nozzles in the vicinity of the substrate surface may be introduced so as to be mixed with each other. In this case, since an EL luminescent film can be formed selectively on the substrate, patternization can be conveniently effected simultaneously with film formation.

The substrate to be used in the present invention may be either electroconductive or electrically insulating, provided that it is selected as desired depending on the use of the deposited film formed. As the electroconductive substrate, there may be mentioned metals such as NiCr, stainless steel, Al, Cr, Mo, Au, Ir, Nb, Ta, V, Ti, Pt, Pd etc. or alloys thereof.

As the insulating substrates, there may be conventionally used films or sheets of synthetic resins, including polyester, polyethylene, polycarbonate, cellulose acetate, polypropylene, polyvinyl chloride, polyvinylidene chloride, polystyrene, polyimde, etc., glasses, ceramics, papers and so on. At least one side surface of these electrically insulating substrates is preferably subjected to treatment for imparting electroconductivity, and it is desirable to provide other layers on the side at which the electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by laminating treatment with the metal, thereby imparting electroconductivity to the surface. The substrate may be shaped in any form such as cylinders, belts, plates or others, and its form may be determined as desired.

The substrate should be preferably selected from among those set forth above in view of adhesion and reactivity between the substrate and the film. Further, if the difference in thermal expansion property between both is great, a large amount of strains may be created within the film to give sometimes no film of good quality, and therefore it is preferable to use a substrate so that the difference in thermal expansion property between both is small.

The present invention is described more in detail below by referring to the Examples.

EXAMPLE 1

By means of the device shown in FIG. 2, an EL device shown in FIG. 1 was prepared.

In FIG. 2, 200-1, 200-2, 200-3 and 200-4 are respectively nozzles, 201-1, 201-2, 201-3 are respectively starting gas introducing pipes, 202 is a transporting pipe for gaseous halogenic oxidizing agent, 204 is a film forming chamber, 207 is a substrate supporting stand, 208 is a substrate, 209 is a heater for heating substrate, 210 is a valve and 211 is an evacuation device.

On the glass substrate 1 was formed an ITO electrode 2 with a thickness of 2000 Å by the sputtering method, followed by formation of a $Y_2O_3$ insulating layer 3 with a thickness of 600 Å at a substrate temperature of 120° C. according to the electron beam vapor deposition method. On the insulating layer 3 was introduced $F_2$ gas at 200 SCCM from the gass, introducing pipe 202 shown in FIG. 2 through the nozzle 200-4 into the film forming chamber 204.

At the same time, through the gas introducing pipes 201-1, 201-2, 201-3 were introduced $(CH_3)_2Zn$, $(CH_3)_2Se$ and $(CH_3)_2Mn$ respectively at the rates of 5 mmol/min, 5 mmol/min, 0.1 mmol/min through the nozzles 200-1, 200-2 and 200-3 into the film forming chamber 204. In this case, $(CH_3)_2Zn$, $(CH_3)_2Se$ and $(CH_3)_2Mn$ undergo chemical reactions by the oxidative action of $F_2$ gas and a ZnSe(Mn) luminescent layer 4 was formed over 30 minutes on the substrate 208 heated to about 400° C. by the substrate heater 209.

Further, on the luminescent layer 4, a $Y_2O_5$ insulating layer 5 with a thickness of 3000 Å was formed at a substrate temperature of 120° C. according to the electron beam vapor deposition method, followed by formation of an aluminum electrode 6 with a thickness of 1000 Å according to the electron beam vapor deposition method.

COMPARATIVE EXAMPLE

By use of a ZnSe target containing Mn which has been used in the prior art, it was subjected to high frequency sputtering in Ar gas atmosphere to form a ZnSe (Mn) luminescent layer 4. Formation of other layers was practiced in the same manner as in Example 1 to prepare an EL device.

By use of the EL devices each prepared according to the methods of the present invention and the prior art shown in Example 1 and Comparative example, a sine wave voltage of 5 KHz was applied between the transparent electrode 2 and the Al electrode 6 and luminancevoltage characteristics were determined.

The results are shown in Table 1.

TABLE 1

| | Threshold voltage (Vth) | Luminance (ft-L) |
|---|---|---|
| Prior art method (Comparative example) | 170 | 510 |
| Present invention (Example 1) | 145 | 935 |

From these results, it appears likely that crystallinity of ZnSe (Mn) is poor in the prior art method to give rise to scattering of electrons by impurities, whereby excitation is effected insufficiently to result in increase of threshold voltage and lowering in luminance. In contrast, in the present invention, it was confirmed that ZnSe (Mn) with good crystallinity was prepared to give an EL device with low threshold voltage and high luminance.

EXAMPLE 2

In place of $(CH_3)_2Zn$, $(CH_3)_2Se$ and $(CH_3)_2Mn$ used in Example 1, the compounds (A), (B) and (C) shown in Table 2 were used respectively as the starting gases for formation of luminescent layers, and the conditions were changed to those shown in Table 2, following otherwise the same procedure as in Example 1, EL devices were prepared.

For these EL devices, a sine wave voltage of 5 KHz was applied to determine the luminance-voltage characteristics. The threshold voltages and luminances obtained are shown in Table 2. Each of the samples gave lower threshold voltage and higher luminance than those of the prior art.

TABLE 2

| Sample | Compound (A) Compound (B) Compound (C) | Luminescent EL layer | Substrate temperature (°C.) | Threshold voltage (Vth) | Luminance (ft-L) |
|---|---|---|---|---|---|
| 1 | $(C_2H_5)_2Zn$ $(CH_3)_2S$ $(C_2H_5)_3Ho$ | ZnS (Ho) | 300 | 105 | 102 |
| 2 | $(C_2H_5)_2Zn$ $H_2S$ $(C_2H_5)Er$ | ZnS (Er) | 290 | 115 | 118 |
| 3 | $(C_2H_5)_2Zn$ $H_2Se$ $(CH_3)_3Tb$ | ZnSe (Tb) | 320 | 150 | 821 |
| 4 | $(C_2H_5)_2Zn$ $H_2Se$ $(C_2H_5)Sm$ | ZnSe (Sm) | 310 | 166 | 211 |
| 5 | $(C_2H_5)_2Zn$ | ZnSe (Nd) | 300 | 165 | 12 |

TABLE 2-continued

| Sample | Compound (A) Compound (B) Compound (C) | Luminescent EL layer | Substrate temperature (°C.) | Threshold voltage (Vth) | Luminance (ft-L) |
|---|---|---|---|---|---|
| | $(CH_3)_2Se$ $(C_2H_5)_3Nd$ | | | | |

As described above, according to the present invention, EL devices excellent in dielectric strength and mechanical characteristics can be obtained with accomplishment of desired high luminance and low threshold voltage. Also, according to the preparation method of the present invention, in formation of a film for EL layer, reproducibility can be improved to enable improvement of film quality as well as uniformization of film quality, and also the film can be advantageously enlarged in area to accomplish easily improvement of productivity as well as bulk production of the film, whereby EL devices can be produced with good yield.

In addition, since film formation is also possible at a low temperature, EL device can be formed also on substrate with poor heat resistance and also the preparation steps can be shortened by low temperature treatment. Further, by controlling the amount of the active species introduced, it is possible to exhibit the effect that the composition and the characteristics of the EL luminescent film formed can be managed.

We claim:

1. A process for producing an electroluminescent film on a substrate having a surface electrode in a film forming space comprising:

introducing into said film forming space gaseous compounds (A), (B), and (C) and a gaseous halogenic oxidizing agent capable of a chmeical reaction with at least one of said gaseous compounds (A), (B), and (C), whereby said electroluminescent film is formed on said surface electrode of said substrate, wherein said gaseous compound (A) is selected from the group consisting of $ZnMe_2$, $ZnEt_2$ and $ZnX_2$, said gaseous compound (B) is selected from $Me_2S$, $Me_2Se$, $Et_2S$ and $Et_2Se$, said gaseous compound (C) is selected from the group consisting of $Me_2Mn$, $Me_3Pr$, $Me_3Sm$, $Me_3Eu$, $Me_3Tb$, $Me_3Dy$, $Me_3Ho$, $Me_3Er$, $Me_3Tm$, $Me_3Md$, $Et_3Mn$, $Et_3Pr$, $Et_3Sm$, $Et_3Eu$, $Et_3Tb$, $Et_3Dy$, $Et_3Ho$, $Et_3Er$, $Et_3Tm$, $Et_3Nd$, $PrX_3$, $SmX_3$, $EuX_3$, $TbX_3$, $DyX_3$, $HoX_3$, $ErX_3$, $TmX_3$, and $NdX_3$, wherein Me, Et and X represent methyl group, ethyl group and halogen respectively, said gaseous halogenic oxidizing agent is selected from the group consisting of $F_2$, $Cl_2$, $Br_2$, and $I_2$.

2. The process according to claim 1, wherein said surface electrode further includes an insulating layer.

3. The process according to claim 1, further including forming an insulating layer and a second electrode on said electroluminescent film.

4. The process according to claim 1, wherein the ratio of the total amount of said compounds (A), (B) and (C) and the amount of said halogenic oxidizing agent introduced into said film forming space is 1/20–100/1.

5. The process according to claim 1, wherein the pressure in said film forming space during film formation is 0.001–100 Torr.

6. The process according to claim 1, wherein the temperature of said substrate during film formation is 50°–1000° C.

* * * * *

UNITED STATES PATENT AND TRADEMARK OFFICE
CERTIFICATE OF CORRECTION

PATENT NO. : 4,804,558
DATED : February 14, 1989
INVENTOR(S) : KEISHI SAITOH, ET AL. Page 1 of 2

It is certified that error appears in the above-identified patent and that said Letters Patent is hereby corrected as shown below:

COLUMN 1

Line 46, "become" should read --exist in an--.

COLUMN 2

Line 41, "MmRn (AS)" should read --MmRn (A)--.

COLUMN 3

Line 56, "forfformation" should read --for formation--.

COLUMN 4

Line 41, "hydrocarbon" should read --hydrocarbons--.

COLUMN 6

Line 11, "ss" should read --As--.
Line 52, "ndzzles" should read --nozzles--.

UNITED STATES PATENT AND TRADEMARK OFFICE

CERTIFICATE OF CORRECTION

PATENT NO. : 4,804,558

DATED : February 14, 1989

INVENTOR(S) : KEISHI SAITOH, ET AL.

It is certified that error appears in the above-identified patent and that said Letters Patent is hereby corrected as shown below:

COLUMN 9

Line 35, "chmeical" should read --chemical--.

COLUMN 10

Line 11, "$Me_3Md$," should read --$Me_3Nd$,--.

Signed and Sealed this

Nineteenth Day of December, 1989

*Attest:*

JEFFREY M. SAMUELS

*Attesting Officer*

*Acting Commissioner of Patents and Trademarks*